(12) United States Patent
Yu et al.

(10) Patent No.: US 6,614,222 B1
(45) Date of Patent: Sep. 2, 2003

(54) SEMICONDUCTOR TESTING APPARATUS

(75) Inventors: Cheng-ji Yu, Hualien (TW); Shou-nan Tsai, Hsinchu (TW); Ching-Yuh Jang, Kaohsiung (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/321,360

(22) Filed: Dec. 18, 2002

(51) Int. Cl.⁷ .................................. G01F 11/00
(52) U.S. Cl. ..................... 324/158.1; 324/765
(58) Field of Search .................. 324/158.1, 765, 324/754, 761, 758; 209/571, 573; 29/701; 414/935, 941, 224

(56) References Cited

U.S. PATENT DOCUMENTS 5,708,222 A * 1/1998 Yonezawa et al. ......... 73/865.8
6,218,852 B1 * 4/2001 Smith et al. ................ 324/761

* cited by examiner

Primary Examiner—Kamand Cuneo
Assistant Examiner—Jimmy Nguyen
(74) Attorney, Agent, or Firm—Birch, Stewart, Kolasch & Birch, LLP

(57) ABSTRACT

A semiconductor testing apparatus including a server, a robot arm, a gearing unit, a drive unit, a transmission unit, a control unit and a testing head. The drive unit drives the gearing unit and the transmission unit so as to rotate the testing head. In addition, the control unit controls the driving speed and driving direction of the drive unit so as to control the rotation speed and rotation direction of the testing head.

7 Claims, 6 Drawing Sheets

SEMICONDUCTOR TESTING APPARATUS

BACKGROUND OF THE INVENTION

1. Field of the Invention

The invention relates to a testing apparatus, and more particularly to a semiconductor testing apparatus for testing semiconductor devices.

2. Description of the Related Art

With the development of the automation, speed and human factor considerations of semiconductor testing apparatus, the design considerations of semiconductors are getting more and more complicated. Therefore, various testing apparatus are required.

Referring to FIG. 1, a conventional semiconductor testing apparatus 1 includes a server 11, a robot arm 12, a gearing unit 13, a hand-actuated unit 14, a transmission unit 15 and a testing head 16.

The server 11 collects and processes tested data. The robot arm 12 has a first end pivotally mounted to the server 11 and a second end opposite to the first end. The second end has a front side mounted with a connection board 12 and an underside mounted with a support member 122. The support member 122 has a fixing member 123 vertically mounted to one side.

The gearing unit 13 is mounted to the support member 122 and is provided with a first transmission shaft and a second transmission shaft (not shown), both of which extend in different directions.

The hand-actuated unit 14 is mounted on the fixing member 123 and is connected to the first transmission shaft of the gearing unit 13 so as to actuate the first transmission shaft.

The transmission unit 15 is provided with a first rotation member 151, a second rotation member 152 and a connection member 153. The first rotation member 151 is axially mounted to the connection board 121, the second rotation member 152 is connected to the second transmission shaft of the gearing unit 13, and the connection member 153 is used to connect the first rotation member 151 to the second rotation member 152.

The testing head 16 is electrically connected to the server 11 and mounted to the connection board 121 on the front side of the robot arm 12. The first rotation member 151 may drive the testing head 16 to rotate. When a user rotates the handle 141 of the hand-actuated unit 14, power from the hand-actuated unit 14 is transmitted to the second transmission shaft through the first transmission shaft of the gearing unit 13, and the second rotation member 152 on the second transmission shaft may rotate accordingly. Then, the power transmission of the connection member 153 may rotate the first rotation member 151, which may then drive the testing head 16 to rotate.

However, because a typical testing head has a predetermined weight of, for example, 350 to 800 KG, it is laborious and time-consuming to manually rotate the hand-actuated unit 14 in order to move the testing head 16 from a testing position to a loading/unloading position; it takes about two minutes to complete the process. In addition, in order to satisfy the flexibility requirement of the semiconductor testing apparatus, the testing head has to be frequently changed and rotated, which is a great burden for the tester who operates the semiconductor testing apparatus. Furthermore, when the tester rotates the handle 141, the testing head 16 tends to frequently seize up due to the rotation of the testing head 16, and the tester may be hurt. In addition, since the semiconductor testing apparatus is manually operated, the development of industry wide automation and speed requirements cannot be satisfied.

Therefore, it is an important subject of the invention to satisfy the automation, speed, human factor and flexibility requirements of the semiconductor testing apparatus, and allow the testing head to quickly and precisely reach the desired testing position and loading/unloading position.

SUMMARY OF THE INVENTION

In view of the above-mentioned problems, an objective of the invention is to provide a semiconductor testing apparatus, which is timesaving and laborsaving.

The invention is characterized in utilizing a drive unit to drive a gearing unit and a transmission unit and thus to rotate the testing head. In addition, a control unit is utilized to control the driving speed and driving direction of the drive unit so as to control the rotation speed and rotation direction of the testing head.

To achieve the above-mentioned objective, the invention provides a semiconductor testing apparatus including a server, a robot arm, a gearing unit, a drive unit, a transmission unit, a control unit and a testing head.

The robot arm has a first end pivotally mounted to the server and a secondend opposite to the first end. The second end has a front side mounted with a connection board and an underside mounted with a support member. The support member has one side to which a fixing member is vertically mounted.

The gearing unit is mounted to the support member and includes a first transmission shaft and a second transmission shaft, both of which extend in different directions.

The drive unit is mounted to the fixing member and connected to the first transmission shaft of the gearing unit to drive the first transmission shaft.

The transmission unit includes a first rotation member axially mounted to the connection board, a second rotation member connected to the second transmission shaft of the gearing unit, and a connection member for connecting the first rotation member to the second rotation member.

The control unit is mounted to the fixing member and electrically connected to the drive unit to control a rotation speed and a rotation direction of the drive unit. The testing head is mounted to the connection board on the front side of the robot arm and electrically connected to the server. The testing head is capable of rotating as the first rotation member rotates. When the drive unit is started, power from the drive unit is transmitted to the second transmission shaft through the first transmission shaft of the gearing unit, the second rotation member on the second transmission shaft rotates accordingly, and the connection member functions to rotate the first rotation member and thus the testing head.

As mentioned above, since the semiconductor testing apparatus of the invention utilizes a control unit to control the drive unit, introduce the power to the gearing unit and the transmission unit, and cause the testing head to operate and rotate, it is possible to make the semiconductor testing apparatus automatic, timesaving and laborsaving, and prevent the tester from being hurt.

BRIEF DESCRIPTION OF THE DRAWINGS

The invention will become more fully understood from the detailed description given in the hereinbelowherein below illustration only, and thus are not limitative of the present invention, and wherein.

DETAILED DESCRIPTION OF THE INVENTION

The semiconductor testing apparatus according to the preferred embodiment of the invention will be described with reference to FIGS. 2 to 6.

Figure 1:
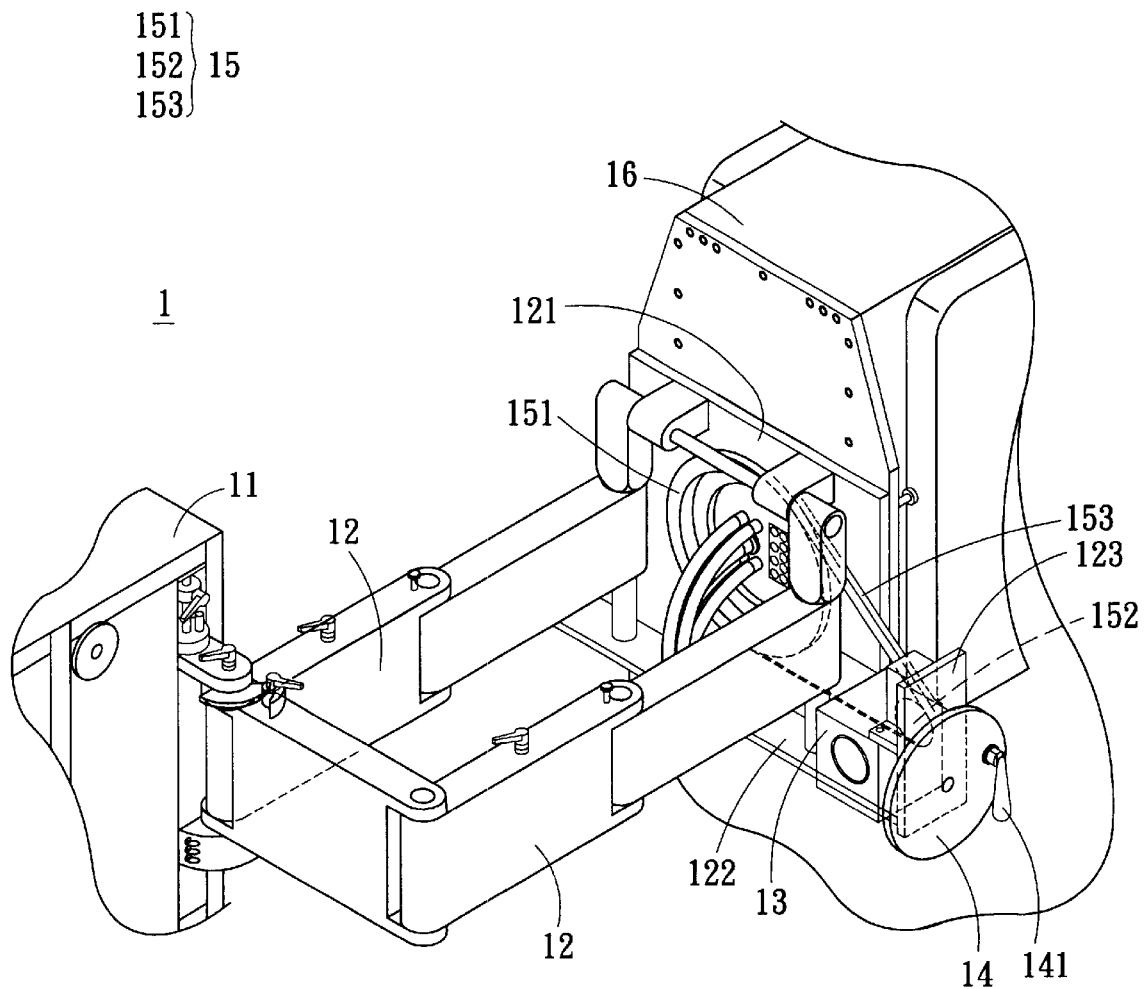
FIG. 1 is a schematic illustration showing a main portion of a conventional semiconductor testing apparatus.
Figure 2:
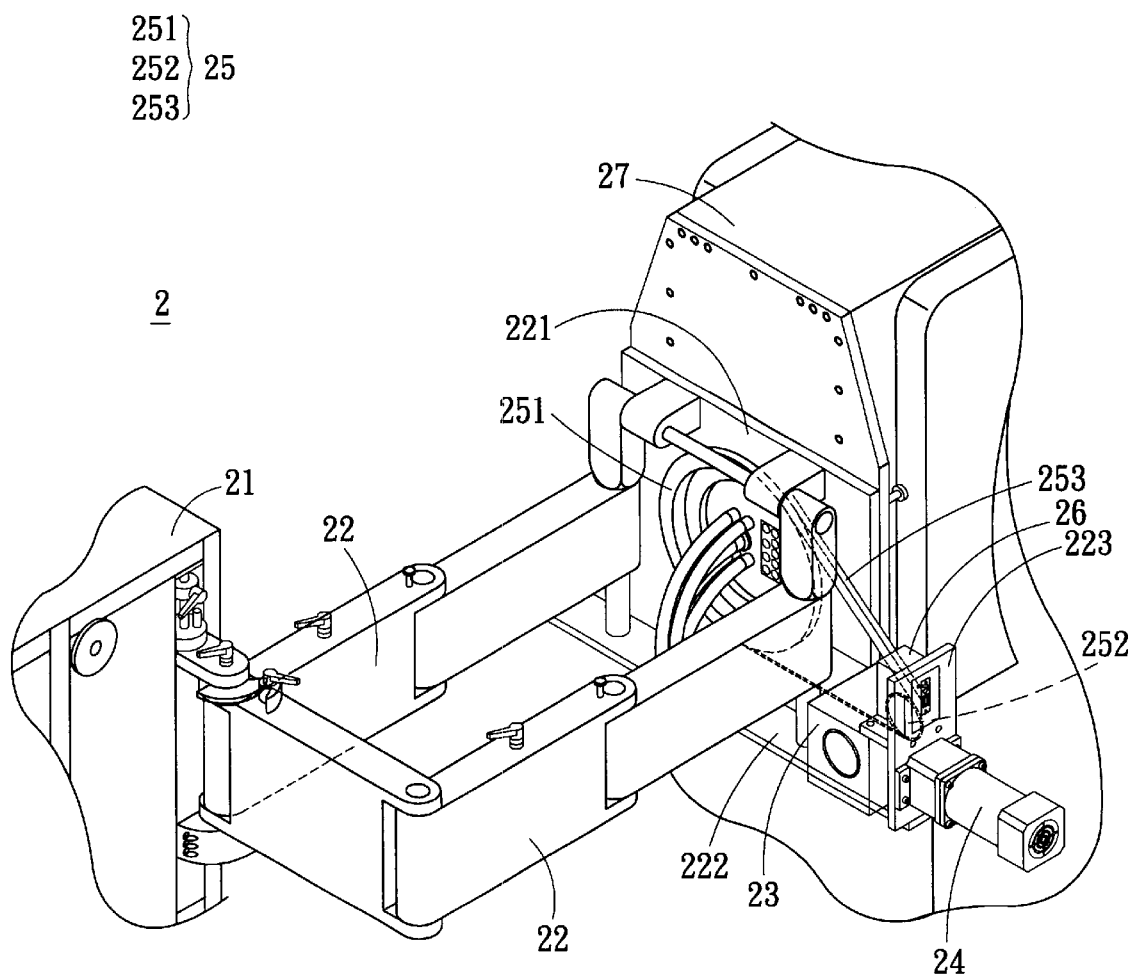
FIG. 2 is a schematic illustration showing a main portion of a semiconductor testing apparatus of the invention.
Figure 3:
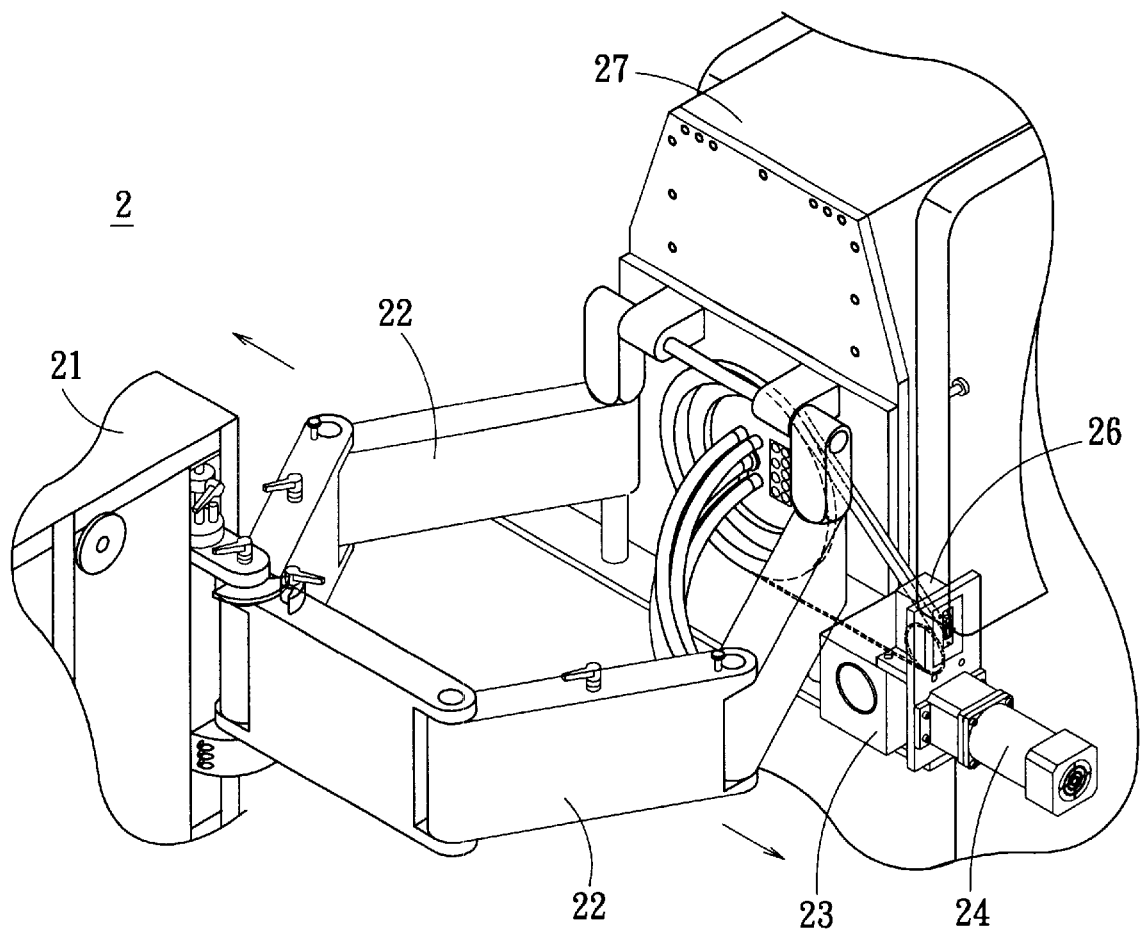
FIG. 3 is a schematic illustration showing an operation state of the semiconductor testing apparatus of the invention.

Referring to FIGS. 2 and 3, a semiconductor testing apparatus 2 of the invention includes a server 21, a robot arm 22, a gearing unit 23, a drive unit 24, a transmission unit 25, a control unit 26 and a testing head 27.

The robot arm 22 has a first end pivotally mounted to the server 21 and a second end opposite to the first end. The second end has a front side mounted with a connection board 221 and an underside mounted with a support member 222. The support member 222 has one side to which a fixing member 223 is vertically mounted. In this embodiment, the robot arm 22 is one with dual arms and multiple shafts, as shown in FIG. 3, and the robot arm 22 may move horizontally.

Figure 4:
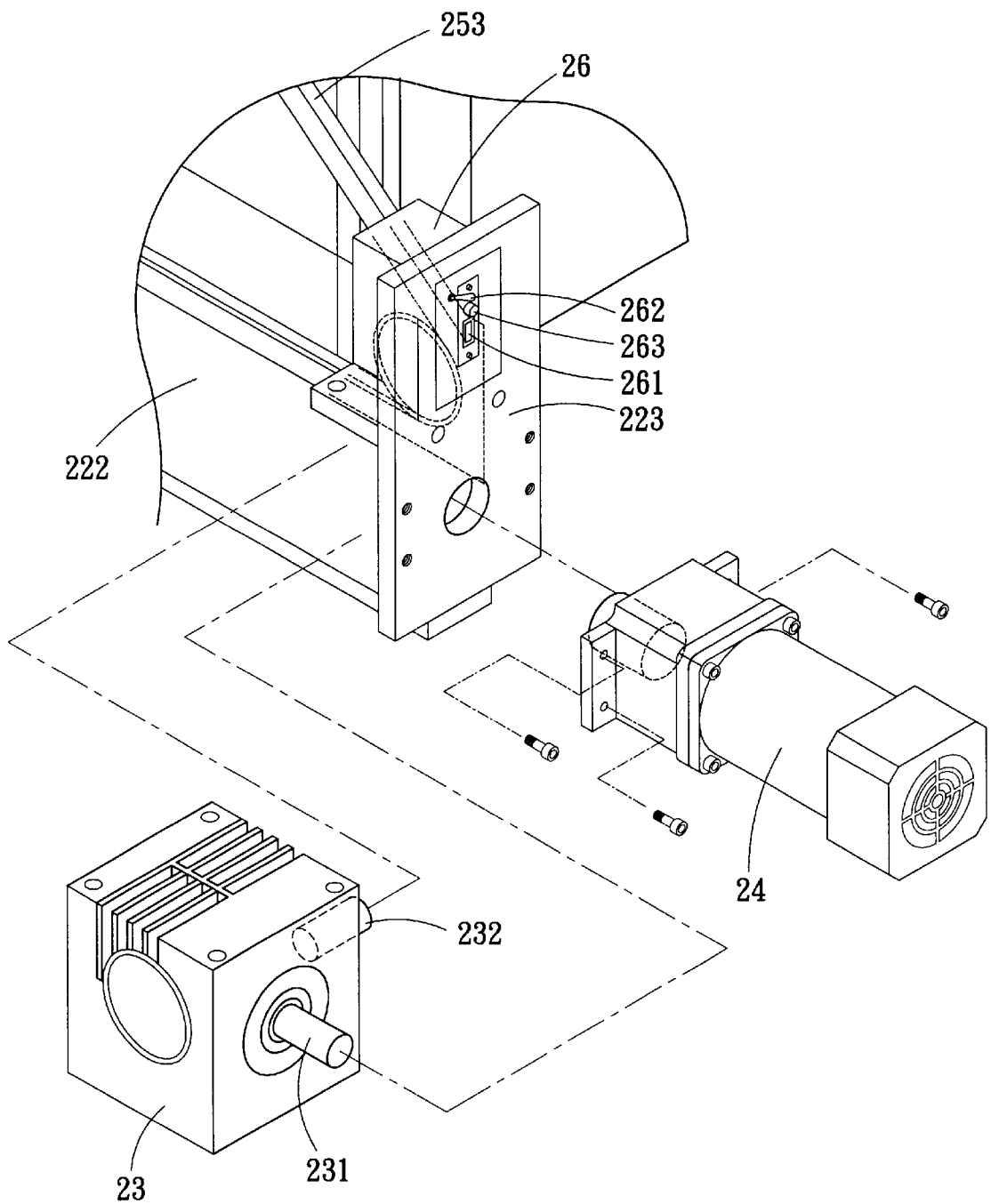
FIG. 4; is a partially enlarged, schematic illustration showing the main portion of the semiconductor testing apparatus of the invention.

As shown in FIG. 4, the gearing unit 23 is mounted to the support member 222 and is provided with a first transmission shaft 231 and a second transmission shaft 232, both of which extend in different directions.

Please refer again to FIG. 4. The drive unit 24 is mounted to the fixing member 223 and is connected to the first transmission shaft 231 of the gearing unit 23 so as to drive the first transmission shaft 231. In this embodiment, the drive unit 24 is a motor.

Figure 5:
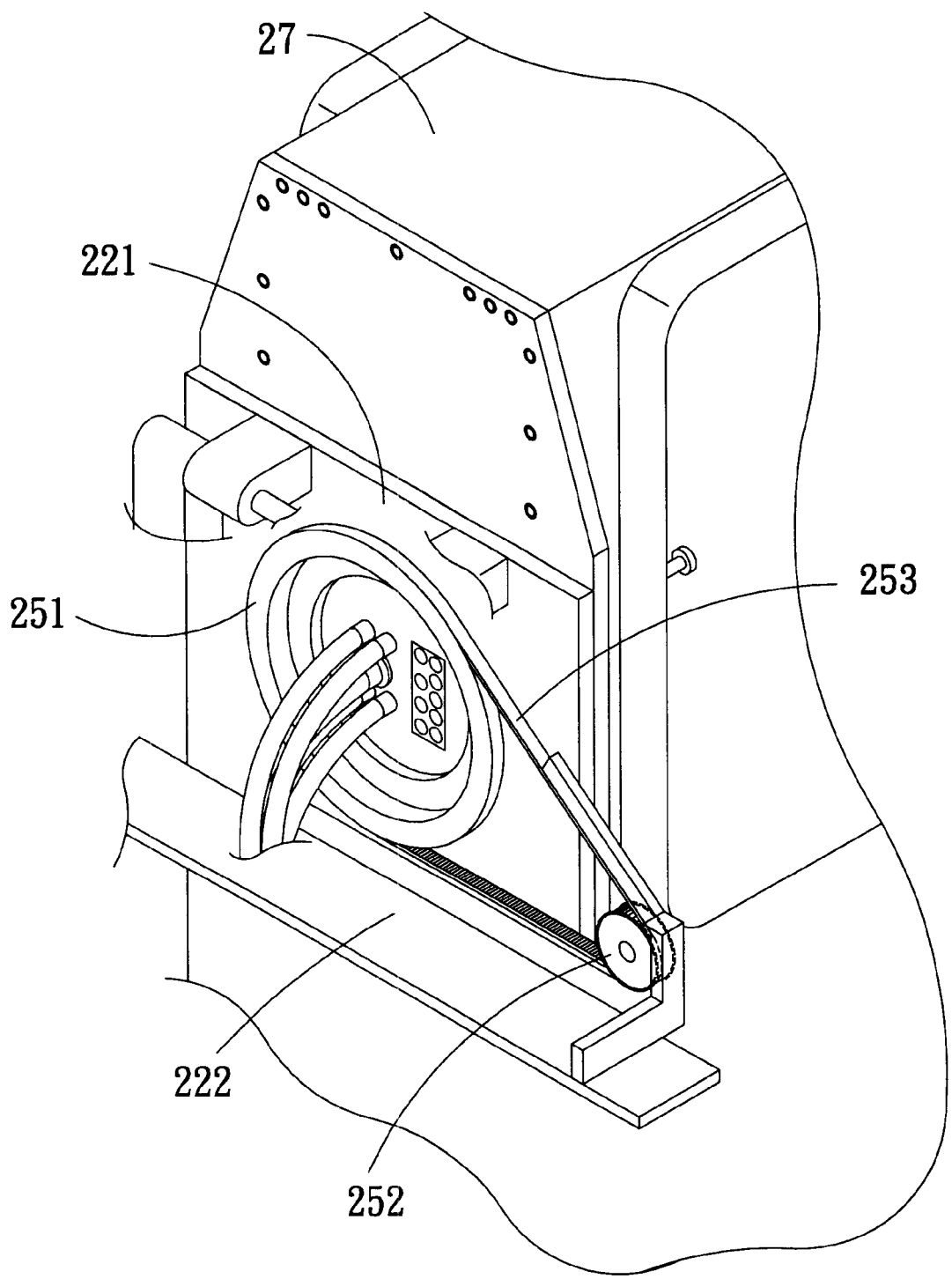
FIG. 5 is an enlarged, schematic illustration showing another main portion of the semiconductor testing apparatus of the invention.
Figure 6:
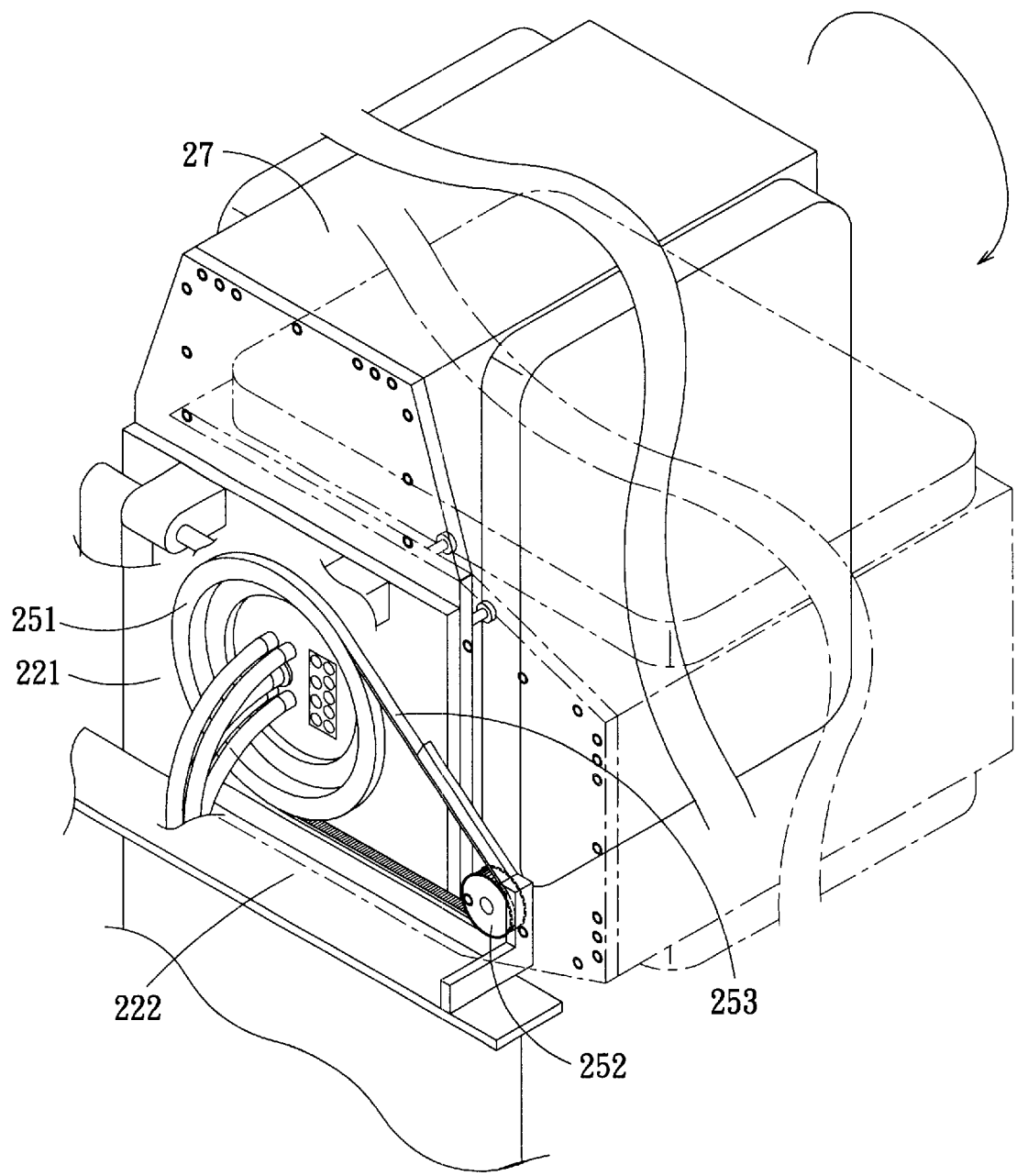
FIG. 6 is an enlarged, schematic illustration showing another main portion of the semiconductor testing apparatus of the invention, wherein a testing head of the semiconductor testing apparatus is under a rotating state.

Referring to FIGS. 4 and 5, the transmission unit 25 includes a first rotation member 251, a second rotation member 252 and a connection member 253. The first rotation member 251 is axially mounted to the connection board 221, and the second rotation member 252 is connected to the second transmission shaft 232 of the gearing unit 23. The connection member 253 connects the first rotation member 251 to the second rotation member 252. In this embodiment, the first rotation member 251 and the second rotation member 252 are gears with different diameters, and the connection member 253 is a toothed belt. The connection member 253 may have various modes corresponding to the first rotation member 251 and the second rotation member 252.

Please refer again to FIG. 4. The control unit 26 is electrically connected to the drive unit 24 (the connection is not shown in the drawing). The control unit 26 includes a power switch 261, a rotation direction controller 262, and a rotation speed controller 263. The power switch 261 controls the start-up and shutdown of the drive unit 24. The rotation direction controller 262 and the rotation speed controller 263 control the rotation direction and the rotation speed of the drive unit 24, respectively. The control unit 26 is mounted to the fixing member 223, as shown in FIG. 4.

Please refer again to FIGS. 2 and 3. The testing head 27 is electrically connected to the server 21, mounted to the connection board 221 at the front side of the robot arm 22, and capable of rotating with the rotation of the first rotation member 251. When the drive unit 24 is started, the power from the drive unit 24 is transmitted to the second transmission shaft 232 through the first transmission shaft 231 of the gearing unit 23. At this time, the second rotation member 252 on the second transmission shaft 232 rotates accordingly. Then, the power transmission of the connection member 253 may rotate the first rotation member 251, which may then drive the testing head 27 to rotate.

In addition, the semiconductor testing apparatus further includes an electric power unit (not shown), and the electric power unit is electrically connected to the control unit 26. The power switch 261 of the control unit 26 controls the electric power unit to operate.

As mentioned above, since the semiconductor testing apparatus of the invention utilizes a control unit 26 to control the drive unit 24, introduce the power to the gearing unit 23 and the transmission unit 25, and allows the testing head 27 to operate and rotate, it is possible to make the semiconductor testing apparatus automatic, timesaving and laborsaving, and prevent the tester from being injured.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A semiconductor testing apparatus, comprising:

a server for collecting and processing tested data;

a robot arm having a first end pivotally mounted to the server and a second end, the second end having a front side mounted with a connection board and an underside mounted with a support member, and the support member having one side to which a fixing member is vertically mounted;

a gearing unit mounted to the support member and including a first transmission shaft and a second transmission shaft, both of which extend in different directions;

a drive unit mounted to the fixing member and connected to the first transmission shaft of the gearing unit to drive the first transmission shaft;

a transmission unit having a first rotation member axially mounted to the connection board, a second rotation member connected to the second transmission shaft of the gearing unit, and a connection member for connecting the first rotation member to the second rotation member;

a control unit mounted to the fixing member and electrically connected to the drive unit to control a rotation speed and a rotation direction of the drive unit; and a testing head mounted to the connection board at the front side of the robot arm and electrically connected to the server, the testing head being capable of rotating as the first rotation member rotates, wherein when the drive unit is started, power from the drive unit is transmitted to the second transmission shaft through the first transmission shaft of the gearing unit, the second rotation member on the second transmission shaft rotates accordingly, and the connection member functions to rotate the first rotation member and thus the testing head.

2. The semiconductor testing apparatus according to claim 1, further comprising an electric power unit electrically connected to the control unit.

3. The semiconductor testing apparatus according to claim 1, wherein the first rotation member and the second rotation member of the transmission unit are gears.

4. The semiconductor testing apparatus according to claim 1, wherein the connection member of the transmission unit is a belt.

5. The semiconductor testing apparatus according to claim 4, wherein the connection member of the transmission unit is a toothed belt.

6. The semiconductor testing apparatus according to claim 1, wherein the drive unit is a motor.

7. The semiconductor testing apparatus according to claim 1, wherein the control unit comprises a power switch for controlling start-up and shutdown of the drive unit, a rotation direction controller for controlling a rotation direction of the drive unit, and a rotation speed controller for controlling the rotation speed of the drive unit.

* * * * *